United States Patent [19]

Shores

[11] Patent Number: 5,591,379
[45] Date of Patent: Jan. 7, 1997

[54] MOISTURE GETTING COMPOSITION FOR HERMETIC MICROELECTRONIC DEVICES

[75] Inventor: A. Andrew Shores, Venice, Calif.

[73] Assignee: Alpha Fry Limited, Croydon, England

[21] Appl. No.: 100,181

[22] Filed: Aug. 2, 1993

Related U.S. Application Data

[63] Continuation of Ser. No. 549,054, Jul. 6, 1990, abandoned.

[51] Int. Cl.$^6$ ........................................ C09K 3/18
[52] U.S. Cl. ..................... 252/194; 501/32; 501/39; 501/80; 523/466; 524/444
[58] Field of Search ................... 252/194; 106/122; 501/32, 39, 80; 523/466; 524/444

[56] References Cited

U.S. PATENT DOCUMENTS

| | | | |
|---|---|---|---|
| 1,425,790 | 8/1922 | Moyer | 252/194 |
| 1,655,248 | 1/1928 | Sharp | 252/194 |
| 2,676,078 | 4/1954 | Young | 252/194 |
| 3,669,922 | 6/1972 | Bartsch et al. . | |
| 3,704,806 | 12/1972 | Plachenov et al. | 220/64 |
| 4,013,566 | 3/1977 | Taylor | 210/502 |
| 4,029,830 | 6/1977 | Yamamoto et al. . | |
| 4,036,360 | 7/1977 | Deffeyes | 206/204 |
| 4,081,397 | 3/1978 | Booe | 252/194 |
| 4,092,290 | 5/1978 | Bowser | 260/42.36 |
| 4,425,410 | 1/1984 | Farrell et al. | 428/516 |
| 4,427,972 | 1/1984 | Ritchie et al. | 357/78 |
| 4,535,098 | 8/1985 | Evaull et al. | 521/149 |
| 4,615,823 | 10/1986 | Tokuyama et al. | 252/194 |
| 4,637,197 | 1/1987 | Banfield | 53/428 |
| 4,749,392 | 6/1988 | Aoki et al. | 55/387 |
| 4,814,364 | 3/1989 | Yoshizaki et al. . | |
| 4,977,009 | 12/1990 | Anderson et al. | 429/76 |
| 5,061,549 | 10/1991 | Shores | 428/207 |
| 5,078,909 | 1/1992 | Shigeta et al. . | |
| 5,122,403 | 6/1992 | Rogiwski et al. | 428/38 |
| 5,244,707 | 9/1993 | Shores | 428/76 |
| 5,304,419 | 4/1994 | Shores | 428/355 |
| 5,401,706 | 3/1995 | Fischer | 502/401 |

FOREIGN PATENT DOCUMENTS 0133159  2/1989  Japan .

OTHER PUBLICATIONS

37 CFR 1.113–1.126 pp. R–34–R–35 Rev. 13 Nov. 1989 USPTO MPEP.

*Primary Examiner*—Mark L. Bell
*Assistant Examiner*—David Sample
*Attorney, Agent, or Firm*—Shapiro and Shapiro

[57] ABSTRACT

This invention describes a composition of matter having moisture gettering properties and applicable as coating or adhesive in a hermetic microelectronic device. The composition is applied to the interior surface of the packaging at a thickness of 0.1–25 mil and comprises a desiccant finely dispersed in a binder which is a water vapor permeable solid material. This may be a polymer, porous ceramic or glass. The desiccant is a particulate solid with 0.2–100 micrometer average particle size. It ought to be able to absorb from a one atmosphere pressure gas containing one volume percent water vapor at least four parts by weight of water vapor per 100 parts by weight of desiccant at 25° C., and for high reliability devices, it should also be able to absorb at least two parts by weight of water vapor per 100 parts by weight of desiccant at 100° C. The desiccant to binder volume ratio ought to be between 0.002 and 2. Molecular sieves are especially useful as the desiccant component of the composition of this invention.

7 Claims, No Drawings

MOISTURE GETTING COMPOSITION FOR HERMETIC MICROELECTRONIC DEVICES

This is a continuation of application Ser. No. 549,054 filed Jul. 6, 1990, now abandoned.

BACKGROUND OF THE INVENTION

This invention describes a composition of matter having moisture gettering properties and applicable as coating or adhesive in a hermetic microelectronic device.

Modern packagings used for electronic devices, such as integrated microcircuits (silicon chips or dies), hybrid microcircuits and surface mounted devices used as transistors, diodes, resistors, capacitors, transducers and such, are designed both to protect the sensitive components and circuits mechanically and environmentally, and to provide a functional interface to macroscopic application, such as printed circuit board. Such packagings are usually constructed from metals or ceramics and hermetically sealed in a moisture free atmosphere to minimize the possibility of corrosion during usage. Hermetic seals may be formed by soldering, welding and sealing through glass.

There has been continuing concern regarding the presence of water vapor in hermetically sealed semiconductor devices. This concern is based upon both theoretically possible failure modes and actual observation of failure caused by corrosion due to the presence of moisture.

Hermetic microelectronic devices used in military, space and other applications requiring high reliability have an upper limit of 5,000 parts per million (ppm, by volume), of water vapor content at the time of fabrication. Package leak rate is limited to $10^{-8}$ atm - cc/sec. maximum to prevent leakage of a significant amount moist ambient air into the packaging during the device's useful lifetime. In spite of extreme precaution, it is very difficult to manufacture a hermetic packaging for microelectronic devices with low water vapor content and to maintain it during its useful lifetime. There are various channels water vapor finds its way to the inside of the enclosure:
1. The various seals in a packaging are usually not perfect and it has a small but enough leak to let ambient air, containing moisture, inside the enclosure.
2. Many epoxies used to bond dies and substrates outgas moisture in the packaging with time.
3. The packaging material itself outgasses a certain amount of moisture. Prebaking prior to sealing may not liberate all the absorbed moisture.
4. The sealing atmosphere may be contaminated with moisture.
5. The testing process itself for leak rate may introduce moisture inside the package if not done with extreme care.

The prior art tried to solve the moisture problem by the application of a moisture barrier coating, also referred to as passivating layer, on the microcircuit. Such products and processes include total passivation with silicone compounds and surface passivation with silicon oxide, silicon nitride and plasma deposition of polymerized hexamethyldisilazane. U.S. Pat. Nos. 4,163,072, 4,059,708 and 4,628,006, issued, in order, to Soos, Heiss, Jr. et al. and Schnessler are illustrative of such methods. However, for a number of practical reasons these techniques were found to be less than adequate.

SUMMARY OF INVENTION

Accordingly, an object of this invention is to minimize corrosion of electronic components and micro circuits by providing and maintaining a low moisture content environment inside a hermetically sealed packaging containing these devices.

Another object of this invention is to provide a composition of matter having moisture gettering properties and applicable as a coating or adhesive in hermetic electronic devices.

The above and other objects are realized in the present invention by applying, as a coating or adhesive, a composition of matter having moisture gettering properties to the interior surface of a hermetic microelectronic device at a thickness of 0.1–25 mil (1 mil=0.001 inch). The getter comprises a desiccant finely dispersed in a binder which is a water vapor permeable solid material. This may be a polymer, porous ceramic or glass. The desiccant is a particulate solid with 0.2–100 micrometer average particle size. It ought to be able to absorb from a one atmosphere pressure gas containing one volume percent water vapor at least four parts by weight of water vapor per 100 parts by weight of desiccant at 25° C. The desiccant to binder volume ratio ought to be between 0.002 and 2.

Some high reliability devices ought to contain a moisture getter whose desiccant component, in addition to its high room temperature moisture gettering capacity described above, should be able to absorb, from a one atmosphere pressure gas containing one volume percent water vapor, at least two parts by weight of water vapor per 100 parts by weight of desiccant at 100° C.

Molecular sieves are especially useful as the desiccant component of the composition of this invention.

Other objects, advantages and novel features of the invention will become apparent from the detailed description of the invention that includes numerous working examples.

DETAILED DESCRIPTION OF THE INVENTION

A composition of matter having moisture gettering properties in a hermetic microelectronic device comprises a desiccant finely dispersed in a binder. The composition can be applied to part or all of the interior surface of the device as a coating or adhesive.

A great number of desiccants or drying agents useful for drying gases are available. They may be solids or liquids. Generically they may be silicates, oxides, hydroxides, halides, sulphates, perchlorates, carbonates, activated carbon, sulfuric acid, glycols and other compositions. The mechanism of dehydration may be physical absorption, chemical reaction to form hydrates and chemical reaction to form a new compound. Some may absorb or react with moisture at room temperature but liberate it at higher temperatures.

The desiccant useful to prepare a moisture getter composition of this invention is a solid particulate material with average particle size of 0.2–100 micrometer, preferably 0.3–50 micrometer. It should be capable of absorbing substantial amounts of water vapor, in some cases even at relatively high temperatures, since many devices have high operating temperatures and they are heated to 100° C. on the moisture analysis tests. The desiccant useful in this invention must be capable of absorbing, independently of its absorption mechanism, from a one atmosphere pressure gas containing one volume percent water vapor, at least four parts by weight of water vapor per 100 parts by weight of desiccant at 25° C. The desiccant of this invention does not generate gaseous by products upon interaction with water vapor.

Examples of such desiccant useful to prepare a composition of this invention are:

silicon dioxide (silica gel), aluminum oxide (activated alumina);

calcium sulfate, calcium chloride, copper sulfate;

potassium carbonate;

perchlorate of magnesium, barium or lithium.

The following desiccants are especially useful since in addition of having the high moisture absorbing capacity at room temperature, they are capable of absorbing from a one atmosphere pressure gas containing one volume percent water vapor at least two parts by weight of water per 100 parts by weight of desiccant at 100° C.: barium oxide, calcium oxide, magnesium oxide, calcium chloride, calcium bromide, lithium chloride, zinc chloride, zinc bromide.

Molecular sieves are especially useful since they are high melting, inert, non corrosive, insoluble solids. Among them the aluminum silicates of the following empirical formula are the most useful ones:

$$M_{2/n} O \cdot Al_2O_3 \cdot xSiO_2 \cdot yH_2O$$

wherein n is a cation of valence n, x is 1.5–15, and y is the number of water molecules associated with the compound. Most are crystallin and contain water in their structure. They all have high internal surface area available for moisture absorption due to the channels or pores which uniformly penetrate the entire volume of the solids. Water, with an effective molecular diameter just under 3 Å absorbs into virtually all grades and pore sizes. The most common molecular sieves are:

| Grade 3A: | Pore Size = 3 Å, | Cation: $K^+$ |
| --- | --- | --- |
| Grade 4A: | Pore Size = 4 Å, | Cation: $Na^+$ |
| Grade 5A: | Pore Size = 5 Å, | Cation: $Ca^+$ |
| Grade 13X: | Pore Size = 13 Å, | Cation: $Na^+$ |
| Grade LZ-4-82: | Pore Size = 8 Å, | Cation: $NH_4^+$ |

The binder useful to prepare a composition of this invention has to be a solid material that is permeable to water vapor. All polymers, at various degrees are naturally permeable to water vapor. Glasses and ceramics, which can also be useful binders, must be made porous by creating channels for water vapor to penetrate. This may be done by various techniques known in the art, such as the use of blowing agents, fast evaporation of water or other gases during formation, fast decomposition of metalloorganic polymers and low temperature or incomplete sintering.

Examples of binders useful to prepare a moisture getter composition are: thermoplastic or thermosetting polymers, elastomers, gel-like and sticky polymers. Examples are polysulfones, polyetherimides, polyacrylates, linear polyester, linear polyurethanes, epoxides, polyimides, thermosetting polyurethanes, polysiloxanes, metal chelate polymers, polydichlorophosphazene. Examples of inorganic binders are silica, silica with 7% titanium made from various organic precursors by reacting with water and partial sintering, low softening temperature glasses, such as the one containing high amounts of lead; alkali metal silicates such as sodium silicate and potassium silicate.

The preparation of the composition of this invention is rather simple. The desiccant is dispersed in the binder, or a solvent or water solution of the binder. To obtain a good dispersion, mechanical mixing and shearing is often necessary, sometimes at elevated temperatures to reduce viscosity. The desiccant to binder volume ratio should be 0.001–2 to obtain a good coating or adhesive, preferably 0.005–1.

The composition may be deposited by a hand probe, brush, stencil or screen printing, doctor blading, syringe dispensing or other convenient technique at room temperature or at the melt at elevated temperature. The coating thickness ought to be 0.1–25 mil, preferably 0.2–15 mil following evaporation of solvent or water, if such diluent was necessary to incorporate into the formulation for ease of processing. For thermosetting polymeric binders a curing or crosslinking step is then followed.

If the desiccant absorbs (getters) water by chemically reacting with it, both mixing and deposition ought to be under anhydrous conditions to prevent premature absorption and maximize moisture gettering capacity in the hermetic package. For physically absorbing desiccants, such as molecular sieves, a moisture desorption step is necessary at 150°–250° C., or at vacuum, if the moisture gettering capacity had decreased by absorption during mixing or deposition.

The composition, usually a paste, may be deposited at part or the whole interior surface of the packaging, or the cover, wall, or top of the microcircuit, depending on other intended functions. If the binder is a polysiloxane or polyurethane, a formulation can be made with the desiccant of this invention to yield a gel-like, sticky substance that can function both a moisture getter and particle getter. If deposited directly on the microcircuit, the composition can function both as moisture getter and conformal coating.

If the composition is formulated with the desiccant and binder of this invention to yield an adhesive, it will also function as a moisture getter in the hermetic package. The adhesive may bond dies, components or the whole circuit. The moisture gettering property may be enhanced by maximizing filet formation around the bonded part.

Hermetically sealing the packaging is usually done in an inert, bone-dry atmosphere. The packaging is then tested for leak rate and the ones with excess leak rate are rejected. The presence of a moisture gettering composition in the hermetic package makes the device more reliable and higher leak rates are allowable than without the getter composition.

The practical examples that follow further illustrate in detail the scope of this invention.

EXAMPLE 1

100 g polysulfone pellets, having a Vicat softening temperature of 190° C., manufactured and sold as Udell 3703 by Amoco Chemical Co., was stirred into 250 g. o-dichlorobenzene heated in a 500 ml. glass beaker to 80° C. with a hot plate to obtain a clear, viscous solution in about 4 hours. The total solids was 28.6% and the viscosity 20,00 cps (Brookfield viscometer, 3.75 per second shear rate). The following ingredients were then stirred into the solution, in order:

o-dichlorobenzene: 50.0

Dehydran ARA 7219, an antifoam manufactured by Henkel Corp.: 0.15

Molecular sieve 4A powder, 2 micrometer average particle size, manufactured by UOP Corp.: 100

The mixture was further stirred at 2,000 rpm for half an hour. The total solids of the paste was 40 weight percent and viscosity 20,000 cps. The desiccant constituted 50 weight percent and 43.6 volume percent of the getter's solids. The following evaluation was conducted to determine moisture absorption in a hermetic package of a hybrid microcircuit:

Nickel plated Kovar cases, numbered 1, 2, 19, 20, 31 through 37 with free internal volume of 1.6 cm³ were cleaned with boiling 1,1,1-trichloroethane and isopropyl alcohol. The inside of covers no. 31 through 37 were printed with the getter using a 10 mil thick stencil, and dried in an oven at 150° C. for 30 minutes. The area covered by the getter was 1.6 cm$^2$, the thickness 4.5 mil and weight 64 mg. All the cases and lids were placed individually in 4 ounce glass jars containing about 1 gram of molecular sieve pellets at the bottom. The jars were placed into an oven at 200° C. for two hours. They were then capped and let cool to room temperature in a sealing box containing 85 parts nitrogen, 15 parts helium and less than 10 ppm moisture. Packages no. 1 and 2 were then seam sealed. The box was then opened on two opposite sides and air was blown in for 15 minutes. The packages were seam sealed in this atmosphere of 70° F. and 65% relative humidity by opening the jars one at a time and complete sealing within 30 seconds. Tests showed that leak rates of packages were not exceeding $10^{-9}$ to $10^{-8}$ atm - cc/sec. Prior to measuring their moisture content, packages no. 35, 36, 37 were screened at 150° C. for 24 hours and cycled 100 times between −65° and +150° C.

Residual gas analysis (RGA), measuring gas composition in the cavity by mass spectrometry, compiled in Table I clearly shows that:
1. The analysis technique is correct, with reasonable errors, since packages 1, 2, 19 and 20, which were included in this experiment as controls, yielded the right results.
2. The getter reduced the moisture content from about 15,000 ppm (no. 19,20) to below 1,000 ppm (No. 31,32, 33), even after extensive temperature cycling (No. 35,36, 37). The average of no. 1 and 2, 350 ppm, was subtracted from the nominal results.
3. No gases were produced as the result of the moisture gettering action of the composition prepared in this example as indicated in the Table by ND=not detected.

C. for 15 seconds and cooled to obtain strong bond.

The substrates were then bonded to Kovar cases, the packages sealed in atmospheric air, leak tested and analyzed for moisture content (RGA), all as in Example 1. The following results were obtained:

|  | $H_2O$, ppm |
| --- | --- |
| Packages sealed in ambient air with the adhesive of this example: | 1478, 571, 921; Avg. = 990 |
| Packages sealed in ambient air but containing no molecular sieve in the adhesive: | 9177, 9417; Avg. = 9297 |

No gases were produced from the moisture gettering action of the adhesive.

EXAMPLE 3

This example shows that a composition can be prepared to result both in moisture gettering and particle gettering properties.

Dow Coring #280A, a 57% total solids solution of a modified polydimethylsiloxane pressure sensitive adhesive, 175.5 g (100 g solids), was weighed out into a 500 ml glass jar and the following ingredients were added while stirring at 1500 rpm:
Antifoam:0.5 g
Toluene: 50
Molecular Sieve 4A, 2 micrometer average diameter: 30

The solution was then printed on lids, dried, the packages incorporated with five pieces of ten micrometer silver flakes, sealed, all as in Example 1. Residual gas analysis showed a decrease of moisture content from 15000 of the hybrids

TABLE 1

| GETTER IN PACKAGE | YES | | | | | | NO | | | |
| --- | --- | --- | --- | --- | --- | --- | --- | --- | --- | --- |
| SEALING ATMOSPHERE | AMBIENT (15000 ppm $H_2O$) | | | | | | | | BONE DRY $N_2/H_6$ | |
| TEMP. CYCLING | NO | | | YES | | | NO | | | |
| PACKAGE NO.: | 31 | 32 | 33 | 35 | 36 | 37 | 19 | 20 | 1 | 2 |
| Nitrogen, % | 77.6 | 77.5 | 77.7 | 78.3 | 78.8 | 78.9 | 78.1 | 77.1 | 82.3 | 82.5 |
| Oxygen, % | 21.4 | 21.5 | 21.4 | 20.5 | 20.1 | 20.0 | 18.9 | 20.1 | ND | 0.08 |
| Argon, % | 0.84 | 0.85 | 0.85 | 0.95 | 0.92 | 0.91 | 0.86 | 0.91 | ND | ND |
| $CO_2$, ppm | 170 | >100 | >100 | 523 | 421 | 318 | 1578 | 1039 | <100 | <100 |
| Moisture, ppm | 1511 | 881 | 977 | 1232 | 1141 | 1081 | 16600 | 14800 | 500 | 200 |
| Helium, % | ND | ND | ND | ND | ND | ND | 0.28 | 0.27 | 17.7 | 17.4 |
| Hydrocarbons, ppm | ND | ND | ND | 258 | 173 | 159 | ND | ND | ND | ND |
| Other gases, ppm | ND | ND | ND | ND | ND | ND | ND | ND | ND | ND |

EXAMPLE 2

This example demonstrates the preparation of a conductive electronic grade adhesive having moisture gettering properties. Ultem 1000 pellets, 100 g, a polyetherimide manufactured by General Electric Co., was dissolved in 400 g N-methylpyrrolidone. The following ingredients were then added to the stirring solution:
Antifoam: 1.0 g.
Silver Flake: 300 g.
Cabosil M-5: 10 g
Molecular Sieve 3A: 15 g
The viscous solution was stirred at 2000 rpm for 30 minutes. The adhesive was then used to bond 6 dies, 0.100 inch square each, to microcircuits printed on one square inch alumina substrates. The adhesive was printed to fully cover 0.110 inch die pads, dried at 150° and 225° C., 10 minutes each, and the dies pressed against the dry adhesive at 280° containing no getter, to under 850 ppm for the ones of this Example. Particle impact noise test (PIND) indicated the absence of free particles—they were embedded into the adhesive.

EXAMPLE 4

This example shows that the moisture gettering composition of this invention may be applied directly to microcircuit as a conformal coating.

Dow Corning Silastic #527, a silicone type encapsulant of medium durometer, 100 grams, was mixed, as in Example 1, with 20 grams of molecular sieve 4A. The mixture was applied with a brush to the microcircuit, cured, the packages sealed, all as in Example 1. Residual gas analysis showed a decrease of water vapor from 15000 of the packages containing no coating of this example to 750 ppm of the ones treated in this example.

EXAMPLE 5–13

The following desiccant/binder pair compositions were evaluated for moisture gettering properties as in Example 1. Coating thicknesses ranged 0.2–15 mil and desiccant to binder ratios from 0.002 to 2. They were found to be functional even at 100° C.

| EXAMPLE | DESICCANT | BINDER |
|---|---|---|
| 5 | Calcium oxide | Polydiallylphthalate |
| 6 | Magnesium oxide, soft burned | Porous glass, soft pt. = 350° C., |
| 7 | Barium oxide | $S_iO_2$, porous, formed by incomplete sintering at 300° C. |
| 8 | Lithium chloride | Polyurethane |
| 9 | Calcium chloride | Epoxy, anhydride cure |
| 10 | Calcium bromide | Polyester, soft. pt. 70° C. |
| 11 | Zinc chloride | Polyacrylate, $T_g$ = –42° C. |
| 12 | Zinc bromide | Cellulose acetate butyrate |
| 13 | Sodium molevular | silicate sieve 4A |

I claim:

1. A composition of matter useful as a desiccant in a hermetic electronic device, comprising a powder dispersed in a binder, wherein said powder is selected from the group consisting of zeolite molecular sieves, activated alumina, silica gel, alkaline earth oxide, and alkali metal carbonate;

said binder is a continuous matrix of porous glass or porous ceramic; and said powder to binder volume ratio is 0.001–2.

2. A composition as in claim 1, wherein said powder is a zeolite molecular sieve.

3. A composition as in claim 2, wherein said binder is a continuous matrix of porous glass.

4. A composition as in claim 2, wherein said binder is a continuous matrix of porous ceramic.

said powder to binder volume ratio is 0.001–2.

5. A composition of matter useful as a desiccant and particle getter in a hermetic electronic device, comprising a powder dispersed in a binder, wherein said powder is selected from the group consisting of zeolite molecular sieves, activated alumina, silica gel, alkaline earth oxide, and alkali metal carbonate;

said binder is a polysiloxane or polyurethane gel which is effective as a particle getter, and said powder to binder volume is 0.001–2.

6. A composition as in claim 5, wherein said powder is a zeolite molecular sieve.

7. A composition as in claim 6, wherein said binder is a polysiloxane gel.

* * * * *